United States Patent [19]
Preslar

[11] Patent Number: 5,640,346
[45] Date of Patent: Jun. 17, 1997

[54] ELECTRICALLY PROGRAMMABLE MEMORY CELL

[75] Inventor: Donald Ray Preslar, Three Bridges, N.J.

[73] Assignee: Harris Corporation, Melbourne, Fla.

[21] Appl. No.: 846,286

[22] Filed: Mar. 3, 1992

[51] Int. Cl.$^6$ ................................................. G11C 16/04
[52] U.S. Cl. ........................... 365/185.1; 365/185.18; 365/185.27; 257/315; 257/318; 257/320
[58] Field of Search ......................... 365/185, 175; 357/23.5, 13; 257/315, 318, 320

[56] References Cited

U.S. PATENT DOCUMENTS

| | | |
|---|---|---|
| 4,035,820 | 7/1977 | Matzen . |
| 4,037,242 | 7/1977 | Gosney . |
| 4,305,083 | 12/1981 | Gutierrez . |
| 4,612,629 | 9/1986 | Harari .................................... 365/185 |
| 4,878,199 | 10/1989 | Mitzutani ............................... 365/185 |

OTHER PUBLICATIONS

M. Kikuchi et al., "A 2048-Bit N-Channel Fully Decoded Electrically Writable/Erasable Nonvolatile Read Only Memory," 1st European Sol. St. Cirkts Conf.-Essire, Canterbury, England (2-5 Sep. 1975), pp. 66-67.

K. Yashikawa et al., "An Eprom Cell Structure for EPLD's Compatible With Single Poly-Si Gate Process,"IEEE Trans. on Elec. Dev., vol. 37 #3, Mar. 1990, pp. 675-679.

*Primary Examiner*—Joseph E. Clawson, Jr.
*Attorney, Agent, or Firm*—Michael Epstein; Henry Schanzer; Daniel Staudt

[57] ABSTRACT

An EPROM cell comprises an MOS device including a floating gate electrode overlying, and ohmically insulated from, the channel region of the MOS device, and a separate diode including a p-n junction having a substrate surface intercept. A floating gate electrode overlies the diode p-n junction intercept and is ohmically isolated therefrom by an intervening insulating layer. Writing of data into the floating gate electrode of the MOS device is achieved by causing a voltage breakdown across the diode p-n junction and the flow of high energy electrons across the junction. A voltage is simultaneously applied to the diode gate electrode thereby attracting some of the high energy electrons through the overlying insulating layer into the diode floating gate electrode. The diode gate electrode is ohmically connected to the MOS floating gate electrode on which some of the electrons are stored for affecting the turn-on, turn-off characteristics of the MOS device.

2 Claims, 1 Drawing Sheet

ELECTRICALLY PROGRAMMABLE MEMORY CELL

BACKGROUND OF THE INVENTION

This invention relates to electrically programmable memory (EPROM) cells, and particularly to a new arrangement for writing and reading data into and from such cells.

EPROM cells comprise a metal-oxide-semiconductor (MOS) device including a control gate electrode overlying a channel region of the device and an ohmically isolated floating gate electrode disposed between the control gate electrode and the channel region. Because of the ohmic isolation of the floating gate electrode, electrons reaching it remain stored thereon and provide a voltage bias which affects the turn on characteristics of the MOS device.

For example, with an NMOS device (N type source and drain regions separated by a P type channel region) having a sufficient quantity of electrons stored on the floating gate, the device is biased in its off state, and requires the application of a positive voltage to the control gate electrode to turn it on.

The presence or absence of electrons stored on the floating gate electrode corresponds to either the storage of a logic 1 or 0 in memory. Reading of the memory comprises applying a voltage to the control gate electrode for changing, or not changing, the on-off state of the MOS device depending upon the presence or absence of the stored electrons.

The writing of data into such cells comprises the collection of electrons onto the floating gate electrode through the insulating material disposed between it and the channel region. This is done by applying a relatively large positive voltage to the control gate electrode and the drain (with respect to the source) which generates a stream of high energy "hot electrons" through the channel region. Owing to the high positive voltage on the control gate electrode, which is capacitively coupled to the floating gate electrode, some of the high energy channel electrons have sufficient energy to overcome the insulating barrier layer, and are attracted to the floating gate electrode. When the data writing voltages are turned off, the electrons which have reached the floating gate electrode remain trapped thereon.

During subsequent reading of the cell, the voltages used to determine the on-off state of the MOS device are sufficiently low to prevent further tunneling of electrons to or from the floating gate electrode, thereby providing a relatively permanent storage of the written data.

One condition necessary for inducing the tunneling mechanism is that the channel region of the MOS devices be relatively short, e.g., approximately one micron or shorter in length, in order that sufficiently high electric fields are present to generate the necessary high energy electrons. MOS devices having such short channels are available, but require high resolution photolithographic manufacturing processes. Thus, in semiconductor devices which are conventionally manufactured with lower resolution processes, it has not been possible to use EPROM cells of the type described herein.

This limitation is overcome in accordance with this invention.

SUMMARY OF THE INVENTION

An EPROM cell comprises an MOS device including a floating gate electrode and a separate diode having a p-n junction extending to a surface of a semiconductor substrate. A floating gate electrode is disposed over the surface intercept of the diode p-n junction and is spaced therefrom by a layer of insulating material. The diode gate electrode is ohmically connected to the MOS device floating gate electrode.

For writing data into the MOS cell, the diode p-n junction is sufficiently highly reverse biased to cause voltage breakdown of the diode and the flow of high energy electrons therethrough. A high positive voltage is applied to the source and drain regions of the MOS device to capacitively couple the positive voltage to the MOS device floating gate electrode and to the diode floating gate electrode connected thereto. Some of the high energy electrons flowing across the p-n junction of the diode are attracted through the intervening insulating layer by the positive voltage on the MOS floating electrode and are stored thereon when the writing voltages are removed.

Reading of the data stored in the MOS device is done by applying a voltage to the anode and cathode of the diode for capacitively coupling the voltage to the diode floating gate electrode, hence to the MOS floating gate electrode. With appropriate voltages applied to the MOS device, the MOS device will be on or off depending upon the presence or absence of charge stored on its floating gate electrode.

Alternatively, and in addition to the structure above-described, a control gate electrode can be provided capacitively coupled to the MOS device floating gate electrode for use in the reading process.

DESCRIPTION OF PREFERRED EMBODIMENTS OF THE INVENTION

Figure 1:
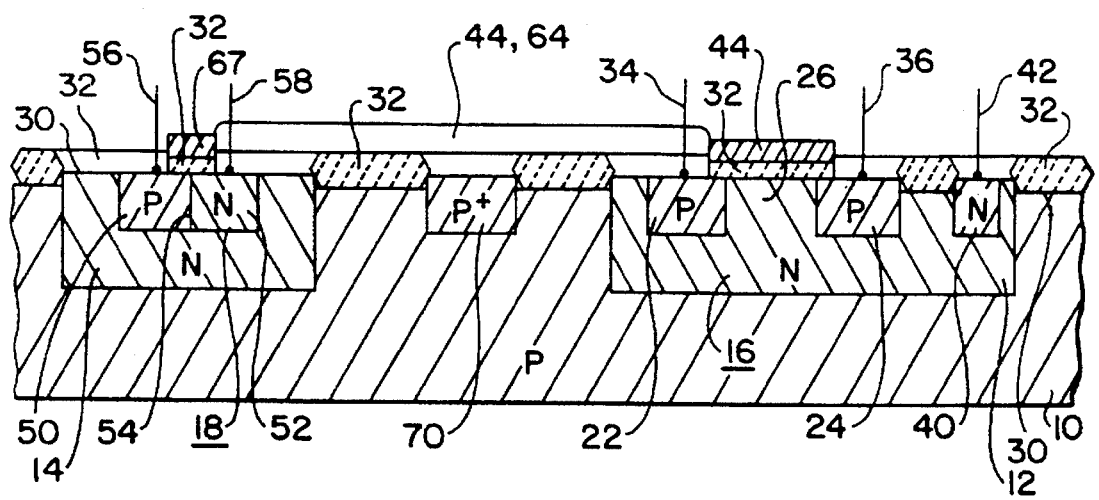
FIG. 1 is cross section of an EPROM cell made in accordance with this invention.
Figure 2:
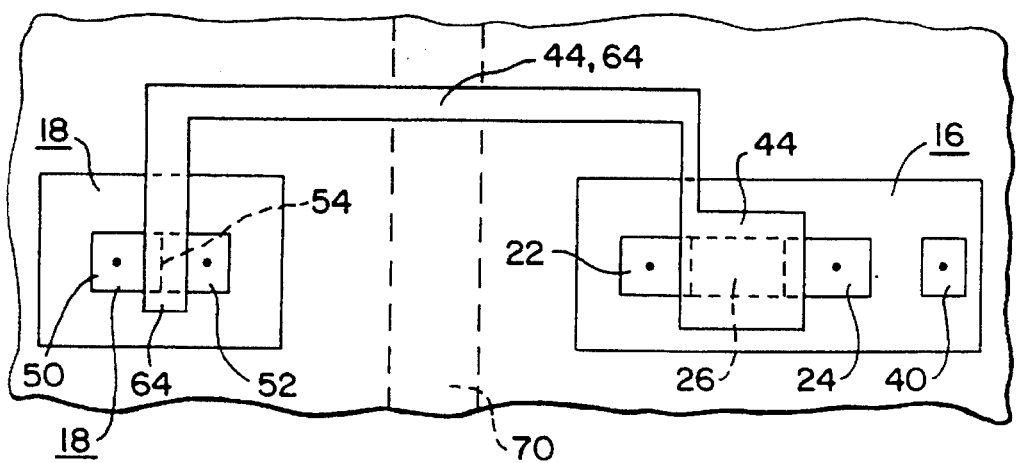
FIG. 2 is a plan view of the cell shown in FIG. 1.

With reference to FIGS. 1 and 2, one example of a single EPROM cell according to this invention comprises a substrate 10 &semiconductor material, e.g., silicon, of P type conductivity, and including two spaced apart "wells" 12 and 14 of N type conductivity. The two wells 12 and 14 include the separate devices of the EPROM cell of the invention. Normally, a plurality of EPROM cells are included in an array of memory cells contained in a substrate. Neither the array of EPROM cells nor the various connections therebetween is shown. Arrays of EPROM cells are known. It is also known to use spaced apart wells for electrically isolating devices contained therein. The use of the wells shown herein is but one example of how EPROM cells according to this invention can be made.

The well 12 contains an MOS device 16 and the well 14 contains a diode 18. Both the MOS device 16 and the diode 18 can be of generally known type and can be fabricated using known processing techniques.

The MOS device 16 includes two p-type regions 22 and 24 spaced apart by an n-type channel region 26. The surface 30 of the substrate 12 is covered by an insulating material layer 32, e.g., silicon dioxide, which is common to both wells 12 and 14. Conductive electrodes 34 and 36 (shown schematically) extend through the layer 32 and into ohmic contact with the regions 22 and 24, respectively. The electrodes 34 and 36 provide means for applying voltages to the regions 22 and 24. Similarly, for applying a voltage to the well 12 itself, referred to as the substrate of the MOS device, a region 40 of n+ conductivity is provided within the well 12 at the surface thereof to which an ohmic connection is made via an electrode 42.

Overlying the channel region 26, but ohmically insulated therefrom by a reduced thickness portion of the layer 32 is a floating gate electrode 44.

The diode 18 includes a highly doped p+ region 50 adjoining a highly doped n+ region 52 and forming a p-n junction 54 therewith. The p-n junction 54 extends to the surface 30 of the well 14 which is covered with the insulating material layer 32. Electrodes 56 and 58 extend through the layer 32 and into ohmic contact with the regions 50 and 52, respectively.

Overlying the surface intercept of the diode p-n junction 54, but ohmically insulated from it by a portion of the layer 32 is a diode floating gate electrode 64, which, in this embodiment of the invention, is at an extension (FIG. 2) of the floating gate electrode 44 of the MOS device 16. Any ohmic connection between the two electrodes 44 and 64 will suffice.

The various electrodes can be, for example, doped polysilicon.

In this embodiment of the invention, and in contrast to the previously described prior art EPROM cells, a separate control gate electrode is not used. However, the MOS device 16 of the EPROM cell disclosed herein can be similar to the MOS devices described in an article by Yoshikowa, et al entitled, "EPROM Cell Structure for EPLD's Compatible with Single Poly-Si Gate Process", IEEE Transactions on ED, Vol. 37, No. 3, March, 1990. The EPROM cells in this article, however, do not include separate diodes of the type shown herein.

For writing data into the inventive EPROMs, hot electrons are caused to pass through the insulating layer 32 overlying the diode junction 54 and into the diode floating gate electrode 64, hence into the MOS device floating electrode 44. This is accomplished by reverse biasing the p-n junction 54 of the diode 18 to a sufficiently high voltage to cause electrical breakdown of the semiconductor material at the junction. The electrical breakdown characteristics of various semiconductor materials are well known. In the breakdown process, high electric fields are created across the p-n junction, and the breakdown currents include high energy electrons.

To attract the high energy electrons through the insulating layer 32, a positive voltage is applied to the diode floating electrode 64. This is accomplished by applying a relatively high (e.g., around 8 volts) positive voltage to the electrodes 34, 36 and 42 of the MOS device 16 for capacitively coupling the positive voltage to the floating electrode 44 and thence to the floating electrode 64.

When the data writing process is completed, the writing voltages are removed, and the electrons which have passed through the diode insulating layer 32 to the gate electrode 44 remain stored thereon.

The stored charge on the MOS device floating gate electrode 44 functions similarly to the prior art EPROM cells for affecting the turn on characteristics of the MOS device 16.

For reading the EPROM cell 10, a voltage is applied between the two regions 22 and 24, and a voltage is capacitively coupled through the layer 32 to the MOS gate electrode 44 by applying a bias voltage to the electrodes 56 and 58 of the diode 18. With the PMOS device 16 shown, the stored charge, if present, acts as a negative bias due to the fixed electron charge on the floating gate 44 which is sufficient to bias the PMOS device in its on state. The amplitude of the electrode 56 and 58 bias voltage is selected so that, even when added to the electron derived negative bias, the floating gate 44 remains negatively biased with respect to the source (22 or 24), and therefore in its on state, and a current will flow between the regions 22 and 24. Conversely, if an electron derived negative bias is not present due to no stored charge, the floating gate voltage is high enough to bias the PMOS device in its off state and no current will flow.

The amplitude of the gate electrode voltage used during the reading process is a function of the parameters of the MOS device, and the selection of the various voltages for use with the disclosed EPROM cells is within the skill of workers in this technology.

As above-described, the means for applying the reading voltage to the MOS gate electrode 44 comprises applying a voltage to both electrodes 56 and 58 of the diode 18 for capacitively coupling a voltage via dielectric layer 32 to the diode electrode 64 and hence to the MOS floating electrode 44.

Alternatively, a separate control gate electrode 70, e.g., a buffed highly doped region, can be provided within the substrate 10 extending beneath the MOS floating gate electrode 44 at some point along its length and capacitively coupled to it via the intervening layer 32 of dielectric material. Thus, a voltage for reading the data stored in the MOS device 16 can be applied to the MOS floating gate electrode 44 via the capacitively coupled control gate electrode 70. This arrangement for reading the data is similar to that shown in the afore-cited article.

As previously noted, a problem associated with the use of prior known EPROM cells is that very short length channel MOS devices are required for purposes of writing data. In the herein disclosed EPROMS, however, the writing of data is accomplished by means of a separate diode, and the prior art dimensional requirements for the MOS devices are not present or relevant. Also, the dimensions of the diodes used are not critical or process limiting.

What is claimed is:

1. A method of writing data into an EPROM cell comprising a semiconductor substrate of a first type conductivity having two spaced apart wells therein of an opposite type conductivity, an MOS device in one of said wells including source and drain regions and a floating gate electrode overlying and ohmically insulated from a channel region of said device, and a diode in the other of said wells, said diode having a pair of adjacent regions providing a p-n junction therebetween and a gate electrode overlying a portion of said junction and being ohmically insulated therefrom, said MOS floating gate electrode being ohmically connected to said diode gate electrode by means of a conductor extending between said wells, the method comprising reverse biasing the diode to cause voltage breakdown and flow of current across said p-n junction, and providing a positive voltage to said source, drain and channel regions of said MOS device for capacitively coupling a positive voltage to said floating gate electrode, hence to said diode gate electrode, for causing transfer of electrons from said diode current to said diode gate electrode.

2. A method of writing data according to claim 1 including, for reading data stored in said MOS device, applying the same voltage to both said diode regions for capacitive coupling to said diode gate electrode, and using said coupled voltage for biasing the gate electrode of said MOS device for determining the data stored therein.

* * * * *